(12) United States Patent
Xue et al.

(10) Patent No.: US 11,821,968 B2
(45) Date of Patent: Nov. 21, 2023

(54) GRADIENT POWER AMPLIFIER SYSTEMS AND METHODS

(71) Applicant: SHANGHAI UNITED IMAGING HEALTHCARE CO., LTD., Shanghai (CN)

(72) Inventors: Mingyu Xue, Shanghai (CN); Haicong Zhang, Shanghai (CN); Bin Cao, Shanghai (CN); Xu Chu, Shanghai (CN); Peng Chen, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 359 days.

(21) Appl. No.: 17/155,120

(22) Filed: Jan. 22, 2021

(65) Prior Publication Data
US 2021/0373097 A1 Dec. 2, 2021

(30) Foreign Application Priority Data
May 26, 2020 (CN) .......................... 202010454671.0

(51) Int. Cl.
*G01R 33/38* (2006.01)
*G01R 33/385* (2006.01)
*H03F 3/21* (2006.01)

(52) U.S. Cl.
CPC ......... *G01R 33/3852* (2013.01); *H03F 3/211* (2013.01)

(58) Field of Classification Search
CPC .............................. G01R 33/3852; H03F 3/211
USPC ........................................................ 330/295
See application file for complete search history.

(56) References Cited

U.S. PATENT DOCUMENTS

| 5,017,871 | A | * | 5/1991 | Mueller | G01R 33/3852 324/318 |
| 5,721,490 | A | | 2/1998 | Takano et al. | |
| 5,909,120 | A | * | 6/1999 | Mori | G01R 33/3852 324/318 |
| 6,741,483 | B1 | | 5/2004 | Stanley | |

(Continued)

FOREIGN PATENT DOCUMENTS

CN 109752637 A 5/2019
CN 110784099 A 2/2020

(Continued)

OTHER PUBLICATIONS

The Extended European Search Report in European Application No. 21175948.5 dated Oct. 26, 2021, 10 pages.

(Continued)

*Primary Examiner* — Patricia T Nguyen
(74) *Attorney, Agent, or Firm* — METIS IP LLC

(57) ABSTRACT

Gradient power amplifier (GPA) systems and methods are provided. A GPA system may include a plurality of paralleled GPAs; and at least one controller operably coupled to the plurality of paralleled GPAs. The at least one controller may be configured to perform operations including: obtaining a total current parameter of the plurality of paralleled GPAs; determining, based on the total current parameter and a target current parameter, a first difference value; and determining, based on the first difference value, a first control parameter of a first GPA of the plurality of paralleled GPAs, wherein the first control parameter is configured to control an output current of the first GPA.

19 Claims, 10 Drawing Sheets

(56) References Cited

U.S. PATENT DOCUMENTS

| | | | |
|---|---|---|---|
| 10,571,538 B2 | 2/2020 | Wang et al. | |
| 10,863,919 B2 | 12/2020 | Xue et al. | |
| 11,372,063 B2* | 6/2022 | Mandal | G01R 33/3635 |
| 2012/0249145 A1 | 10/2012 | Lai et al. | |
| 2013/0162250 A1* | 6/2013 | Sabate | G01R 33/3614 |
| | | | 324/309 |
| 2016/0357202 A1 | 12/2016 | Ma et al. | |
| 2019/0137581 A1* | 5/2019 | Kawajiri | G01R 33/3621 |
| 2019/0369183 A1* | 12/2019 | Wang | G01R 33/3628 |

FOREIGN PATENT DOCUMENTS

| | | |
|---|---|---|
| CN | 110995181 A | 4/2020 |
| EP | 2910965 A1 | 8/2015 |

OTHER PUBLICATIONS

Shuji Watanabe et al., Power Conversion PWM Amplifier with Two Paralleled Four Quadrant Chopper for MRI Gradient Coil Magnetic Field Current Tracking Implementation, 30th Annual IEEE Electronics Specialists Conference, 909-913, 1999.

Juan Sabate et al., Parallel Operation of Switching Amplifiers Driving Magnetic Resonance Imaging Gradient Coils, The 4th International Power Electronics and Motion Control Conference, 1563-1567, 2004.

\* cited by examiner

GRADIENT POWER AMPLIFIER SYSTEMS AND METHODS

CROSS-REFERENCE TO RELATED APPLICATIONS

This application claims priority to Chinese Patent Application No. 202010454671.0, filed on May 26, 2020, the contents of which are hereby incorporated by reference.

TECHNICAL FIELD

The present disclosure generally relates to magnetic resonance (MR) technology, and more particularly, gradient power amplifier (GPA) systems and methods in MR technology.

BACKGROUND

Magnetic resonance technology has been widely used in disease diagnosis and/or treatment. An MR system may include Gradient Power Amplifiers (GPAs), which are configured to drive a gradient coil of the MR system. Two or more GPAs may be operably connected in parallel in a circuit (i.e., two or more GPAs operating in-phase into a common gradient coil) to amplify gradient signals for the MR system. Circulating currents often exist due to the differences among main circuits of the two of more paralleled GPAs. Existing methods often use a high-inductance coupler of a large volume between the paralleled GPAs to reduce or eliminate circulating currents in the circuit, thereby resulting in a large and expensive GPA system. Further, a reduced control bandwidth is usually necessary due to the large coupler. Therefore, it is desirable to provide GPA systems and methods with a low cost, a small volume, and enhanced dynamic response performance.

SUMMARY

According to a first aspect of the present disclosure, a gradient power amplifier (GPA) system is provided. The GPA system may include a plurality of paralleled GPAs; and at least one controller operably coupled to the plurality of paralleled GPAs. The at least one controller may be configured to perform operations including: obtaining a total current parameter of the plurality of paralleled GPAs; determining, based on the total current parameter and a target current parameter, a first difference value; and determining, based on the first difference value, a first control parameter of a first GPA of the plurality of paralleled GPAs, wherein the first control parameter is configured to control an output current of the first GPA.

In some embodiments, the first control parameter of the first GPA may be determined based on the first difference value using at least one of: a proportional-integral (PI) algorithm, a prediction algorithm, or a pole assignment algorithm.

In some embodiments, the first control parameter may be further configured to control an output current of a second GPA of the plurality of GPAs.

In some embodiments, the at least one controller may be further configured to perform the operations including: determining a second control parameter of the first GPA based on an average current parameter of the plurality of paralleled GPAs; and determining a total control parameter of the first GPA based on the first control parameter and the second control parameter, wherein the total control parameter is configured to control the output current of the first GPA.

In some embodiments, the determining the second control parameter of the first GPA may include: determining, based on the total current parameter, the average current parameter of the plurality of paralleled GPAs; obtaining a first current parameter of the first GPA; determining, based on the first current parameter and the average current parameter, a second difference value; and determining, based on the second difference value, the second control parameter.

In some embodiments, the GPA system may further comprise a coupler configured for current sharing control of the plurality of paralleled GPAs.

In some embodiments, the coupler may include at least one of a current sharing reactor, a transformer, or a magnetic core.

In some embodiments, the obtaining the total current parameter of the plurality of GPAs may include: obtaining an output current parameter of a circuit of the plurality of GPAs as the total current parameter.

In some embodiments, the obtaining the total current parameter of the plurality of GPAs may include: determining a sum of a plurality of output current parameters of the plurality of GPAs as the total current parameter, wherein each of the plurality output current parameters corresponds to a GPA of the plurality of GPAs.

In some embodiments, the total current parameter may be a total output current value of the plurality of GPAs or a total current error of the plurality of GPAs, wherein the total current error is a difference between the total output current value and the target current parameter.

In some embodiments, the GPA system may further comprise at least one current sensing device for obtaining the total current parameter of the plurality of paralleled GPAs or an output current parameter of each of the plurality of paralleled GPAs.

According to a second aspect of the present disclosure, a method for controlling a gradient power amplifier (GPA) system including a plurality of paralleled GPAs and at least one controller operably coupled to the plurality of paralleled GPAs is provided. The method may include: obtaining a total current parameter of the plurality of paralleled GPAs; determining, based on the total current parameter and a target current parameter, a first difference value; and determining, based on the first difference value, a first control parameter of a first GPA of the plurality of paralleled GPAs, wherein the first control parameter is configured to control an output current of the first GPA.

According to a third aspect of the present disclosure, a non-transitory readable medium is provided. The non-transitory readable medium may include at least one set of instructions for controlling a gradient power amplifier (GPA) system. When executed by at least one processor of an electrical device, the at least one set of instructions may direct the at least one processor to perform a method. The method may include: obtaining a total current parameter of the plurality of paralleled GPAs; determining, based on the total current parameter and a target current parameter, a first difference value; and determining, based on the first difference value, a first control parameter of a first GPA of the plurality of paralleled GPAs, wherein the first control parameter is configured to control an output current of the first GPA.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

Figure 1:
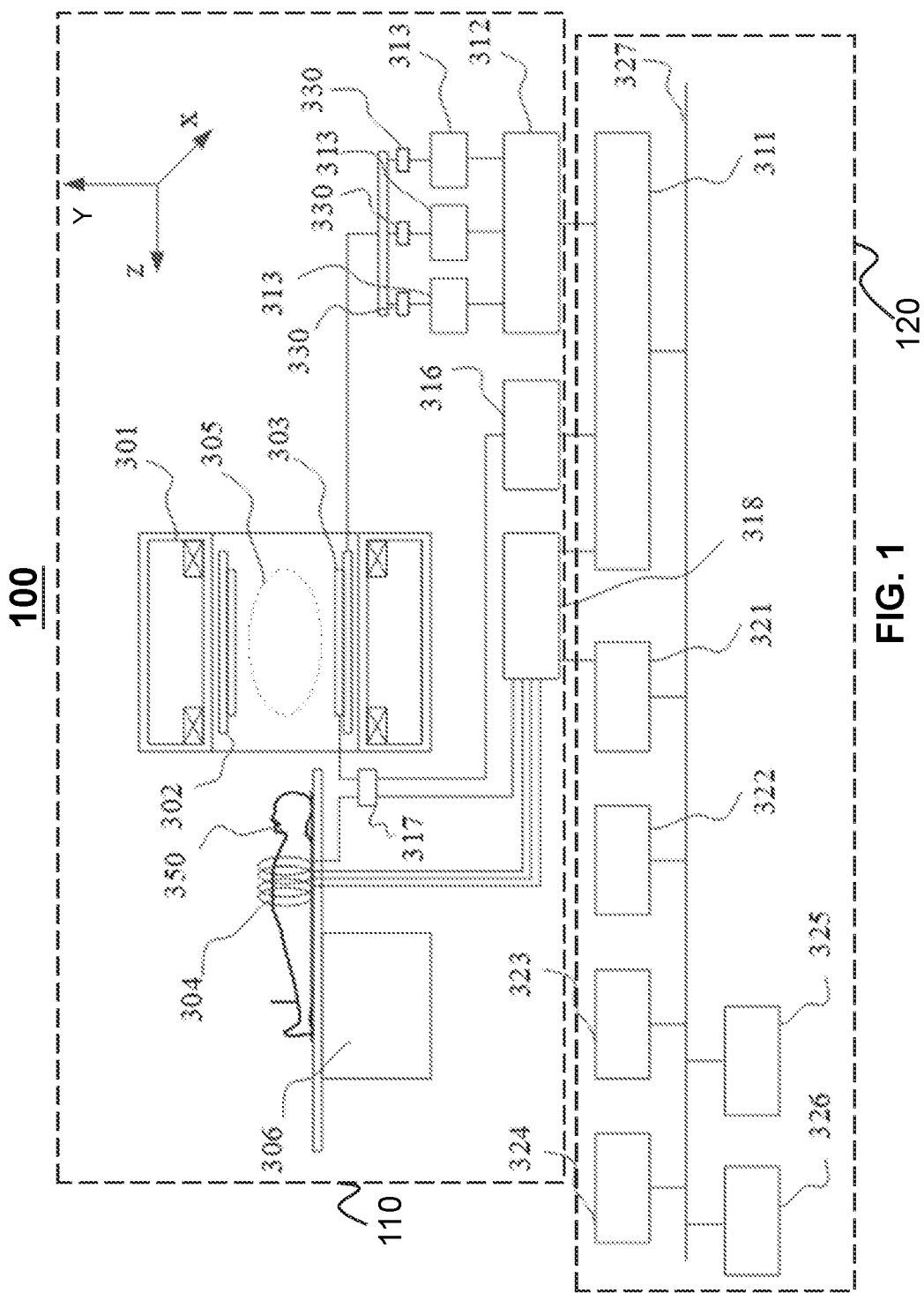
FIG. 1 is a schematic diagram illustrating exemplary MRI system according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., a processor including a GPA controlling unit 322 as illustrated in FIG. 1) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items. The term "image" in the present disclosure is used to collectively refer to image data (e.g., scan data, projection data) and/or images of various forms, including a two-dimensional (2D) image, a three-dimensional (3D) image, a four-dimensional (4D) image, etc. The term "pixel" and "voxel" in the present disclosure are used interchangeably to refer to an element of an image.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are GPA systems and methods for a magnetic resonance system. The magnetic resonance system may include an imaging system and/or a magnetic resonance spectroscopy system. In some embodiments, the imaging system may include a single modality imaging system and/or a multi-modality imaging system. The single modality imaging system may include, for example, a magnetic resonance imaging (MRI) system. The multi-modality imaging system may include, for example, an X-ray imaging-magnetic resonance imaging (X-ray-MRI) system, a single photon emission computed tomography-magnetic resonance imaging (SPECT-MRI) system, a positron emission tomography-magnetic resonance imaging (PET-MRI) system, a digital subtraction angiography-magnetic resonance imaging (DSA-MRI) system, etc. It should be noted that the descriptions below are provided with reference to an imaging system for illustration purposes, and not intended to limit the scope of the present disclosure.

The term "imaging modality" or "modality" as used herein broadly refers to an imaging method or technology that gathers, generates, processes, and/or analyzes imaging information of an object. The object may include a biological object and/or a non-biological object. The biological object may be a human being, an animal, a plant, or a portion thereof (e.g., a cell, a tissue, an organ, etc.). In some embodiments, the object may be a man-made composition of organic and/or inorganic matters that are with or without life.

The term "parallel GPAs" as used herein refers to two or more GPAs that operate in-phase into a common load (e.g., a common gradient coil) in a circuit.

An aspect of the present disclosure relates to GPA systems and methods. The GPA systems and methods may obtain a total current parameter of a plurality of paralleled GPAs. The plurality of paralleled GPAs refers to two or more GPAs operating in-phase into a common load (e.g., a common gradient coil) in a circuit. In some embodiments, the GPA systems and methods may determine a difference value between the total current parameter and a predetermined target current parameter to control currents of the plurality of paralleled GPAs. For example, the GPA systems and methods may determine a control parameter of a GPA of the plurality of paralleled GPAs based on the difference value. The control parameter may be configured to control an output current of the GPA. In some embodiments, the GPA systems and methods may determine an average current parameter of the plurality of paralleled GPAs to control currents of the plurality of paralleled GPAs. For example, the GPA systems and methods may determine a control parameter of a GPA of the plurality of paralleled GPAs based on the average current parameter. The control parameter may be configured to control an output current of the GPA. In some circumstances (e.g., a bandwidth of a circulating current in the circuit being below a predetermined bandwidth, e.g., 10 kHz), no coupler is used to control the outputs of the plurality of paralleled GPAs. In some circumstances (e.g., a bandwidth of the circulating current in the circuit exceeding the predetermined bandwidth, e.g., 10 kHz), a low-inductance coupler (e.g., a magnetic core) of a small volume may be used together with a current-sharing circuit considering the difference value between the total current parameter and the predetermined target current parameter (or the average current parameter of the plurality of paralleled GPAs) to control currents of the plurality of paralleled GPAs. Accordingly, GPA systems and methods with a low cost, a small volume, and enhanced dynamic response performance may be achieved.

FIG. 1 is a schematic diagram illustrating exemplary MRI system 100 according to some embodiments of the present disclosure. As shown in FIG. 1, the MRI system 100 may include an MRI device 110 and a processing device 120. In some embodiments, the MRI device 110 be operably connected to the processing device 120 through a wireless network or directly via a wired connection. As used herein, "operably coupled" indicates that two or more components (e.g., devices, units, modules, etc.) are coupled in any suitable manner for operation and/or communication, including wired, wirelessly, or some combination thereof.

The MRI device 110 may be configured to obtain one or more images relating to a subject. The image relating to a subject may include an image, image data (e.g., projection data, scan data, etc.), or a combination thereof. In some embodiments, the image may include a two-dimensional (2D) image, a three-dimensional (3D) image, a four-dimensional (4D) image (e.g., a series of 3D images acquired over time), or the like, or any combination thereof. The subject may be biological or non-biological. For example, the subject may include a patient, a man-made object, etc. As another example, the subject may include a specific portion, an organ, and/or tissue of the patient. For example, the subject may include the head, the neck, the thorax, the heart, the stomach, a blood vessel, soft tissue, a tumor, nodules, or the like, or any combination thereof, of a patient. As shown in FIG. 1, the MRI device 110 may include a main magnet 301, a gradient coil 302, a body coil 303, a local coil 304, a bore 305, a table 306, a gradient signal generator 312, a plurality of GPA groups 313, a radio frequency (RF) excitation pulse generator 316, a switch control unit 317, an RF signal receiver 318, and a current sensing device 330.

In some embodiments, the table 306 may support a subject 350 and move the subject 350 into (or out from) the bore 305 along a Z-axis shown in FIG. 1. During an imaging process, the main magnet 301 may be configured to generate a main magnetic field. The pulse control unit 311 may control the RF excitation pulse generator 316 to generate RF pulses. The RF pulses may be amplified. After the switch control unit 317 is turned on, the body coil 303 and/or the local coil 304 may emit the amplified FR pulses to the subject 350. The pulse control unit 311 may also control the gradient signal generator 312 to generate gradient signals. In some embodiments, the gradient signal generator 312 may generate three mutually orthogonal gradient signals. For example, the gradient signal generator 312 may generate a gradient signal parallel to the X axis, a gradient signal parallel to the Y axis, and a gradient signal parallel to the Z axis. The plurality of GPA groups 313 may be configured to amplify the gradient signals. For example, a first GPA group 313 of the plurality of GPA groups 313 may be used to amplify the gradient signal parallel to the X axis, a second GPA group 313 of the plurality of GPA groups 313 may be used to amplify the gradient signal parallel to the Y axis, and a third GPA group 313 of the plurality of GPA groups 313 may be used to amplify the gradient signal parallel to the Z axis. In some embodiments, each of the plurality of GPA group 313 may include two or more paralleled GPAs. The gradient signals may be amplified and the gradient coil 302 may generate a gradient field. During the imaging process, a magnetic resonance (MR) signal may be generated. The RF signal receiver 318 may receive the MR signal, and transmit the MR signal to the image reconstruction unit 321. The image reconstruction unit 321 may reconstruct an image relating to the subject 350 based on the MR signal.

The current sensing device 330 may be configured to obtain a current parameter of a paralleled GPA (or a GPA group) of the plurality of GPA groups 313. For example, the current sensing device 330 may obtain a total current parameter of a plurality of paralleled GPAs of a GPA group 313. Alternatively, the current sensing device 330 may obtain a current parameter of each of the plurality of paralleled GPAs of a GPA group 313. The current sensing device 330 may include any suitable current sampling device. For example, the current sensing device 330 may include a current transformer, a voltage transformer, or the like, or any combination thereof. In some embodiments, the current sensing device 330 may be operably coupled to an output end of a paralleled GPA to obtain the output current parameter of the GPA. Additionally or alternatively, the current sensing device 330 may be operably coupled to an output end of a GPA group 313 to obtain the total current parameter of the plurality of paralleled GPAs of the GPA group 313. In some embodiments, the current sensing device 330 may transmit the total current parameter of the plurality of paralleled GPAs and/or the current parameter of each of the plurality of paralleled GPAs to the processing device 120. The processing device 120 may control one or more paralleled GPAs of the plurality of GPA groups 313 based on the total current parameter of the plurality of paralleled GPAs and/or the current parameter of each of the plurality of paralleled GPAs to the processing device 120.

The processing device 120 may be configured to control the MRI device 110 (or one or more components of the MRI device 110), and/or process data and/or information obtained from the MRI device 110. The processing device 120 may include a pulse control unit 311, an image reconstruction unit 321, a GPA controlling unit 322, a display unit 323, an in/output (I/O) unit 324, a storage device 325, a communication port 326, and a communication bus 327. The pulse control unit 311, the image reconstruction unit 321, and the GPA controlling unit 322 may be implemented on a processor. In some embodiments, the pulse control unit 311, the image reconstruction unit 321, the GPA controlling unit 322, the display unit 323, the I/O unit 324, the storage device 325, and the communication port 326 may exchange information and/or data with each other via the communication bus 327.

The processor (including the pulse control unit 311, the image reconstruction unit 321, and the GPA controlling unit 322) may process data and/or information obtained from one or more components of the MRI system (e.g., the current sensing device 330). For example, the processor (e.g., the GPA controlling unit 322) may obtain a total current parameter of the two or more paralleled GPAs of a GPA group 313 from the current sensing device 330 and determine a first difference value between the total current parameter and a target current parameter. The first difference value may be configured to control one or more GPAs of the GPA group 313. In some embodiments, the processor (e.g., the GPA controlling unit 322) may also be configured to control one or more components of the MRI system 100. In some embodiments, the processor (e.g., the GPA controlling unit 322) may be configured to control one or more of the plurality of GPA groups 313 (or one or more paralleled GPAs of a GPA group 313). For example, the processor (e.g., the GPA controlling unit 322) may determine a control parameter of a paralleled GPA and transmit the control parameter to the gradient signal generator 312 to generate a gradient signal for the paralleled GPA. By controlling one or more of the plurality of paralleled GPAs of a GPA group 313 this way, circulating currents among the plurality of paralleled GPAs in a circuit of the GPA group 313 may be reduced or eliminated. In some embodiments, a measure frequency for controlling the plurality of GPA groups may be selected to achieve a desired operation characterized by one or more factors including the level of circulating currents, the computational burden on the processor 322, etc. As used herein, a measure frequency refers to the frequency at which a current parameter of a GPA group 313 (e.g., a total current parameter, an average current parameter, etc., of a GPA group 313) or of a GPA of a GPA group 313 (e.g., a current parameter of a GPA) is measured on the basis of which a control parameter may be generated. For example, the processor may measure the current parameter every (or less than) 12.5 microseconds to determine whether to generate a control signal, and the measure frequency may be 80 kHz or higher.

In some embodiments, the pulse control unit 311, the image reconstruction unit 321, and/or the GPA controlling unit 322 may work as a processor for executing computer instructions (program codes) and perform functions of the processing device 120 in accordance with techniques described herein. The computer instructions may include, for example, routines, programs, objects, components, signals, data structures, procedures, modules, and functions, which perform particular functions described herein. In some embodiments, the GPA controlling unit 322 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the processing device 120. However, it should be noted that the processing device 120 in the present disclosure may also include multiple processors. Thus operations and/or method steps that are performed by one processor as described in the present disclosure may also be jointly or separately performed by the multiple processors. For example, if in the present disclosure the processor of the processing device 120 executes both operation A and operation B, it should be understood that operation A and operation B may also be performed by two or more different processors jointly or separately in the processing device 120 (e.g., a first processor executes operation A and a second processor executes operation B, or the first and second processors jointly execute operations A and B). As another example, the processing device 120 may include a plurality of processors (or a plurality of GPA controlling units 322), each of which is configured to control only one paralleled GPA of a GPA group 313 of the plurality of GPA groups 313 (or control paralleled GPAs of only one GPA group 313 of the plurality of GPA groups 313). Alternatively, the processing device 120 may include only one processor (or only one GPA controlling unit 322) configured to control the plurality of GPA groups 313.

The display unit 323 may include a display device for displaying an image to a user. Exemplary display devices may include a liquid crystal display (LCD), a light-emitting diode (LED)-based display, a flat panel display, a curved screen, a television device, a cathode ray tube (CRT), or the like, or a combination thereof. The I/O unit 324 may include a keyboard, a mouse, a control box, a touch screen, a speech input, a trackball, or any other comparable I/O mechanism capable of inputting or outputting a data stream. The I/O 324 may input or output signals, data, and/or information. In some embodiments, the I/O 324 may enable user interaction with the processing device 120 and/or the MRI device 110. In some embodiments, the I/O 324 may include an input device and an output device. Exemplary input devices may include a keyboard, a mouse, a touch screen, a microphone, or the like, or a combination thereof. Exemplary output devices may include a display device, a loudspeaker, a printer, a projector, or the like, or a combination thereof.

The storage device 325 may store data, instructions, and/or any other information. In some embodiments, the storage device 325 may store data obtained from one or more components of the MRI system (e.g., the MRI device 110, the GPA controlling unit 322, the current sensing device 330, etc.). In some embodiments, the storage device 325 may store data and/or instructions that the GPA controlling unit 322 may execute or use to perform exemplary methods described in the present disclosure. In some embodiments, the storage device 325 may include a mass storage device. Merely by way of example, the storage device 325 may include a hard disk drive (HDD), a floppy drive, a solid state drive (SSD), a flash memory, an optical disk, a magnetic optical disk, a magnetic tape, a universal serial bus (USB) drive, or the like, or any combination thereof. In some embodiments, the storage device 325 may include a removable storage medium or a non-removable storage medium. The storage device 325 may be installed inside or outside a data processing device (e.g., the processor, the GPA controlling unit 322). In some embodiments, the storage device 325 may include non-volatile storage device. In some embodiments, the storage device 325 may include a read-only memory (ROM) and a random access memory (RAM). Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, an electrically alterable ROM (EAROM), a flash, or the like, or any combination thereof. Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary DRAM may include a fast page mode DRAM (FPMDRAM), an extended date out DRAM (EDODRAM), a synchronous DRAM (SDRAM), etc.

The communication port 326 may be connected with a network to facilitate data communications. The communication port 326 may establish connections between the processing device 120 and the MRI device 110 (or other devices, such as a terminal device, a storage device of the MRI system 100). The connection may be a wired connection, a wireless connection, or a combination of both that enables data transmission and reception. The wired connection may include an electrical cable, an optical cable, a telephone wire, or the like, or any combination thereof. The wireless connection may include a Bluetooth network, a Wi-Fi network, a WiMax network, a WLAN, a ZigBee network, a mobile network (e.g., 3G, 4G, 5G, etc.), or the like, or any combination thereof. In some embodiments, the communication port 326 may be a standardized communication port, such as RS232, RS485, etc. In some embodiments, the communication port 326 may be a specially designed communication port. For example, the communication port 326 may be designed in accordance with the digital imaging and communications in medicine (DICOM) protocol.

The communication bus 327 may be configured to connect components of the processing device 120. The communication bus 327 may include hardware, software, or a combination thereof. For example, the communication bus 327 may include a data bus, an address bus, a control bus, an expansion bus, a local bus, etc. Merely by way of example, the communication bus 327 may include an accelerated graphics port (AGP) or any other graphics port, an extended industry standard architecture (EISA) bus, a front side bus (FSB), a hyper transport (HT) interconnection, an industry standard architecture (ISA) bus, an InfiniBand interconnection, a low pin count (LPC) bus, a storage bus, a micro channel architecture (MCA) bus, a peripheral component interconnect (PCI) bus, a PCI-Express (PCI-X) bus, a serial advanced technology attachment (SATA) bus, a video electronics standards association local bus (VLB), etc.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, a component of the MRI system 100 may be replaced by another component that can implement the functions of the component. In some embodiments, the storage device 325 may be a data storage including cloud computing platforms, such as a public cloud, a private cloud, a community and hybrid cloud, etc. However, those variations and modifications do not depart the scope of the present disclosure.

Figure 2:
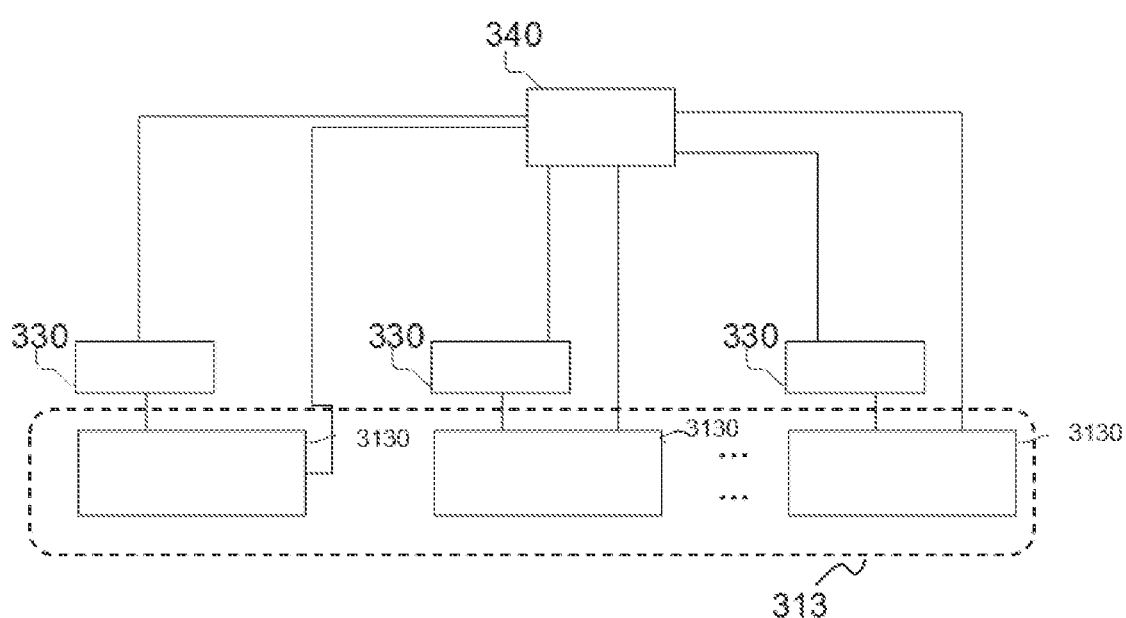
FIG. 2 is a block diagram illustrating an exemplary GPA control system according to some embodiments of the present disclosure.

FIG. 2 is a block diagram illustrating an exemplary GPA control system 200 according to some embodiments of the present disclosure. As shown in FIG. 2, the GPA control system 200 may include a GPA group 313, a plurality of current sensing devices 330, and a controller 340. The GPA group 313 may include a plurality of paralleled GPAs 3130. Each of the plurality of current sensing devices 330 may be operably coupled to one of the plurality of paralleled GPAs 3130 to obtain a current parameter (or an output current value) of the corresponding paralleled GPA. Alternatively, only one current sensing device 330 and one controller 340 may be operably coupled to a GPA group 313. For example, the current sensing device 330 may be operably coupled to the plurality of paralleled GPAs 3130 at a node where the output currents of the plurality of paralleled GPAs 3130 may be measured. The current sensing device 330 may directly obtain a total current parameter (or a sum of output current values) of the plurality of paralleled GPAs 3130 of the GPA group 313.

As shown in FIG. 2, the controller 340 may be operably coupled to each paralleled GPA 3130 and the corresponding current sensing devices 330. The controller 340 may be configured to execute exemplary processes in the present disclosure for controlling one or more paralleled GPAs 3130 of the GPA group 313. For example, the controller 340 may obtain the total current parameter of the plurality of paralleled GPAs 3130 by summing the current parameter (or the output current value) of each paralleled GPA 3130. As another example, the controller 340 may determine a first difference value between the total current parameter and a target current parameter. The target current parameter may be a predetermined value stored in a storage device (e.g., a storage device of the controller 340, the storage device 325, or an external storage device of the MRI system 100). In some embodiments, the target current parameter may be determined according to a gradient field that is needed for obtaining an MRI image of the subject 350. As still another example, the controller 340 may determine a first control parameter of a first GPA of the plurality of paralleled GPAs, so as to control an output current of the first GPA. More descriptions regarding the controlling an output current of the plurality of paralleled GPAs may be found elsewhere in the present disclosure. See, e.g., FIG. 5 and relevant descriptions thereof. In some embodiments, the controller 340 may be implemented on a processor or the processing device 120 as illustrated in FIG. 1. For example, the controller 340 may be a sub-module of the processor. As another example, the controller 340 may include one or more components of the processing device 120.

Figure 3:
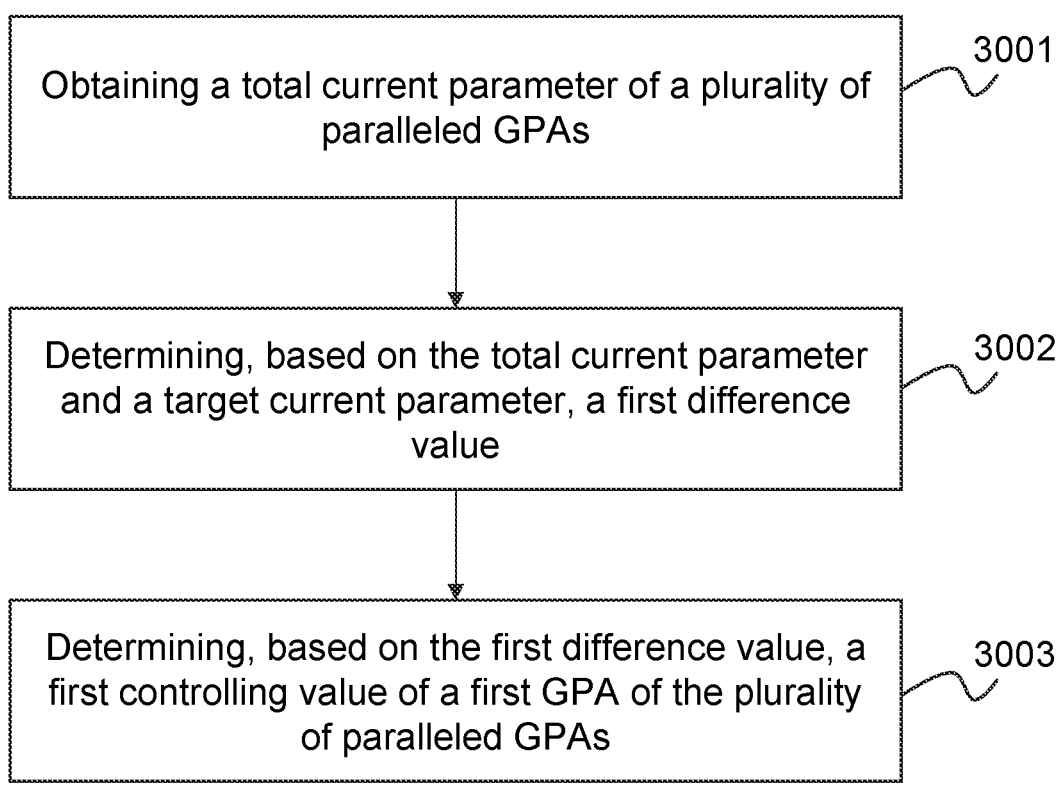
FIG. 3 is a flowchart illustrating an exemplary process for controlling a paralleled GPA according to some embodiments of the present disclosure.

FIG. 3 is a flowchart illustrating an exemplary process 300 for controlling a paralleled GPA according to some embodiments of the present disclosure. In some embodiments, the process 300 may be executed by the system 100. For example, the process 300 may be implemented as a set of instructions (e.g., an application) stored in a storage device (e.g., the storage device 325). In some embodiments, the controller 340 (or, the processor, the GPA controlling unit 322) may execute the set of instructions and may accordingly be directed to perform the process 300.

In 3001, the controller 340 (or the processing device 120, the processor, the GPA controlling unit 322) may obtain a total current parameter of the plurality of paralleled GPAs.

The total current parameter may be a parameter value relating to current values of the plurality of paralleled GPAs. In some embodiments, the total current parameter may be a total output current value of the plurality of paralleled GPAs. For example, the total current parameter may be a sum of a plurality of output current values of the plurality of paralleled GPAs. In some embodiments, the total current parameter may be a total current error of the plurality of GPAs. The total current error may be a difference between the total output current value and a target total current value. In some embodiments, the target total current value may be a predetermined value stored in a storage device (e.g., a storage device of the controller 340, the storage device 325, or an external storage device of the MRI system 100). In some embodiments, the target total current value may be determined according to a gradient field that is needed for obtaining an MRI image of the subject 350.

In some embodiments, the controller 340 may obtain an output current parameter (e.g., an output current value) of a circuit of the plurality of GPAs as the total current parameter. For example, the current sensing device 330 may obtain the output current parameter (or a sum of output current values) of the plurality of paralleled GPAs at a node of the circuit where the output currents of the plurality of paralleled GPAs of the circuit may be measured. The controller 340 may obtain the output current parameter of the circuit as the total current parameter from the current sensing device 330. In some embodiments, the controller 340 may determine a sum of a plurality of output current parameters of the plurality of GPAs as the total current parameter. Each of the plurality output current parameters may correspond to a GPA of the plurality of GPAs. For example, a current sensing device 330 may be operably coupled to each of the plurality of paralleled GPAs to obtain a current parameter (e.g., an output current value) of the corresponding paralleled GPA. The controller 340 may obtain the plurality of output current parameters from the plurality of current sensing devices 330 and determine the sum of the plurality of output current parameters as the total current parameter.

Figure 4:
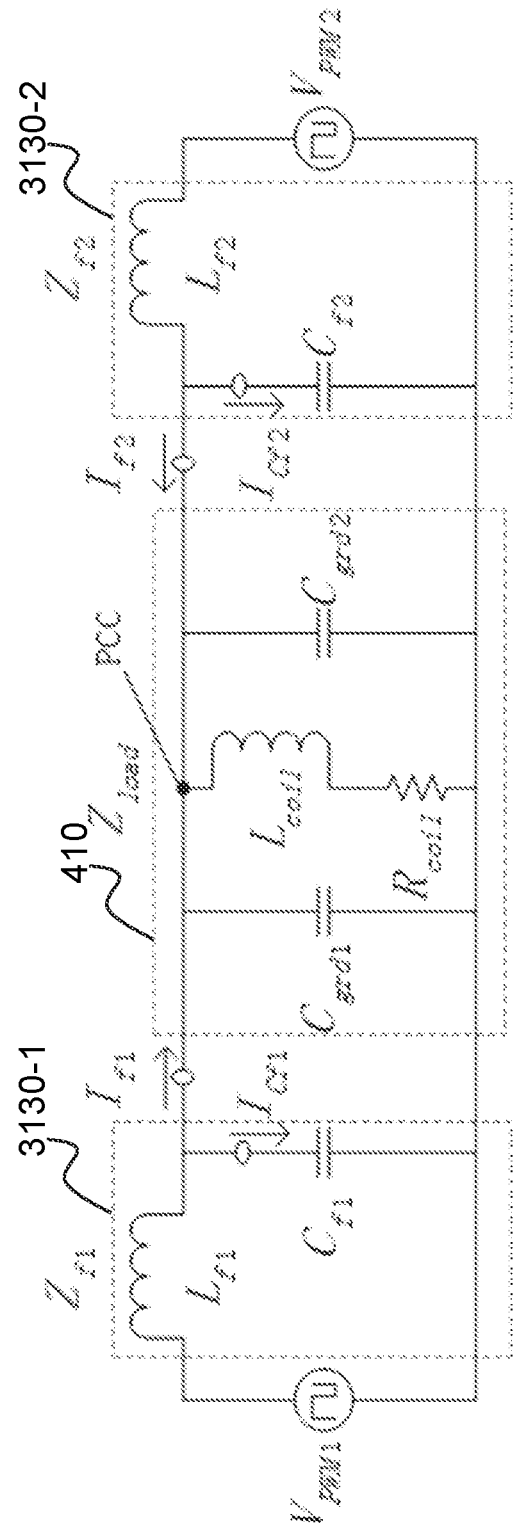
FIG. 4 is a schematic diagram illustrating an exemplary circuit according to some embodiments of the present disclosure.

FIG. 4 is a schematic diagram illustrating an exemplary circuit 400 according to some embodiments of the present disclosure. As shown in FIG. 4, a GPA 3130-1 and a GPA 3130-2 are operated in-phase into a common gradient coil 410, constituting two paralleled GPAs 3130. $L_{f1}$ represents an inductance of an output filter of the GPA 3130-1, $L_{f2}$ represents an inductance of an output filter of the GPA 3130-2, $C_{f1}$ represents a capacitance of the output filter of the GPA 3130-1, $C_{f2}$ represents a capacitance of the output filter of the GPA 3130-2, $L_{coil}$ represents an equivalent inductance of the gradient coil 410, $R_{coil}$ represents an equivalent resistance of the gradient coil 410, $C_{grd1}$ and $C_{grd1}$ represent capacitances of filters of the gradient coil 410, $V_{PWM1}$ represents an output voltage of the GPA 3130-1, and $V_{PWM2}$ represents an output voltage of the GPA 3130-2. An output current parameter (an output current value) of the GPA 3130-1 may be $I_{f1}$, and an output parameter (an output current value) of the GPA 3130-2 may be $I_{f2}$. The total current parameter of the two paralleled GPAs 3130 may be $I_{f1}+I_{f2}$.

Returning to FIG. 3, in 3002, the controller 340 (or the processing device 120, the GPA controlling unit 322) may determine a first difference value based on the total current parameter and a target current parameter.

The first difference value may be a difference between the total current parameter and the target current parameter. In some embodiments, the total current parameter is a total output current value of the plurality of paralleled GPAs, and the target current parameter is a target total current value. Accordingly, the first difference value may be a difference value between the total output current value of the plurality of paralleled GPAs and the target total current value. For example, a total output current value is equal to 12.4512 A, and a target total current value is equal to 12 A. If four significant digits are valid, the total output current may be determined as 12.45 A, and a first difference between the total output current value and the target total current value is equal to 0.45 A on the basis of which a control parameter for the plurality of paralleled GPAs, or a portion thereof, may be determined. In some embodiments, the total current parameter is a total current error between the total output current value and the target total current value, and the target current parameter is a target current error. Accordingly, the first difference value may be a difference value between the total current error and the target current error. For example, a total output current is equal to 12.4512 A, and the target current parameter is equal to 12 A. If four significant digits are valid, the total current error may be determined as 0.4512 A. If the target current error is zero, a first difference between the total current error and the target current error may be equal to 0.4512 A on the basis of which a control parameter for the plurality of paralleled GPAs, or a portion thereof, may be determined.

In some embodiments, the target current parameter (e.g., a target total current value or a target current error) may be determined according to an imaging need. Exemplary imaging needs may include that an image is needed to examine existence of a lesion, that an image is needed to identify a contour of a lesion in order to generate a treatment plan or execute a treatment plan regarding the lesion, characteristics of an imaging process (or modality) with respect to an imaging site of a subject, or the like, or a combination thereof. Exemplary characteristics of an imaging process (or modality) with respect to an imaging site of a subject may include the sensitivity and/or specificity of the imaging process (or modality) with respect to the imaging site, tolerance of the imaging site to the imaging process (or modality) (e.g., tolerance of the imaging site to energy deposition during the imaging process). For example, a desired gradient field may be determined according to a certain imaging need. The target total current value of the plurality of paralleled GPAs, which may generate the desired gradient field, may be determined based on the desired gradient field. As another example, a maximum gradient amplitude of the gradient field and/or a minimum gradient amplitude of the gradient field may be determined according to the actual imaging needs. Under the gradient field of a maximum gradient amplitude (or a minimum gradient amplitude), an image quality of a generated MRI image satisfying a predetermined condition may be obtained. A maximum total current value corresponding to the maximum gradient amplitude (or a minimum total current value corresponding to the minimum gradient amplitude) may be predetermined. The target current error may be determined by determining a difference value between the target total current value and the maximum total current value (or the minimum total current value). In some embodiments, the target current parameter (e.g., the target total current value or the target current error) may be predetermined and stored in a storage device (e.g., a storage device of the controller 340, the storage device 325, or an external storage device of the MRI system 100). The controller 340 may retrieve the target current parameter from the storage device and determine the first difference value.

In 3003, the controller 340 (or the processing device 120, the GPA controlling unit 322) may determine a first control parameter of a first GPA of the plurality of paralleled GPAs based on the first difference value. The first control parameter may be used to control an output current of the first GPA.

In some embodiments, the first GPA may be any paralleled GPA of the plurality paralleled GPAs. The first control parameter may be configured to use the total current parameter of the plurality of paralleled GPAs for feedback control of the first GPA. In some embodiments, the first control parameter of the first GPA may be determined based on the first difference value using an algorithm. For example, the algorithm may include a proportional-integral (PI) algorithm, a prediction algorithm, a pole assignment algorithm, or the like, or any combination thereof. In some embodiments, when the plurality of GPAs operate according to their respective control parameters, a first difference value between the total current parameter and the target current parameter may be below a threshold. For instance, the total output current value of the plurality of GPAs operating according to their respective control parameters may approach the target total current value such that a first difference value between the total output current value and the target total current value is below a threshold. As another example, the total current error present when the plurality of GPAs operate according to their respective control parameters may approach the target current error such that a first difference value between the total current error and the target current error is below a threshold.

Figure 5:
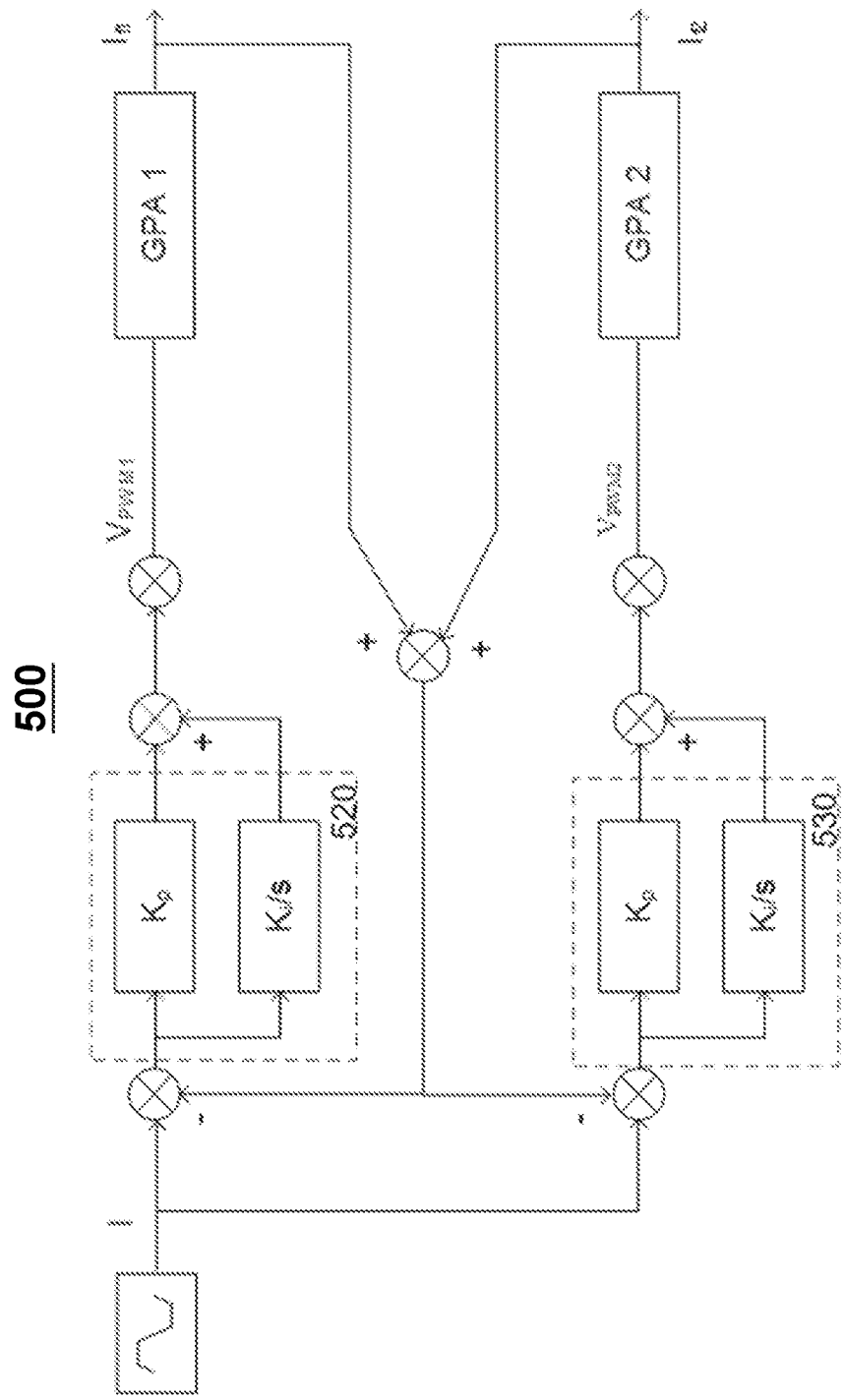
FIG. 5 is a schematic diagram illustrating an exemplary GPA control process according to some embodiments of the present disclosure.

FIG. 5 is a schematic diagram illustrating an exemplary GPA control process 500 according to some embodiments of the present disclosure. As shown in FIG. 5, a sum of an output current value $I_{f1}$ of GPA1 and an output current value $I_{f2}$ of GPA2 may be determined as a total current parameter $I_{f1}+I_{f2}$. A difference value between the total current parameter $I_{f1}+I_{f2}$ and a target total current value I may be determined as the first difference value $[I-(I_{f1}+I_{f2})]$. A PI controller 520 may perform a PI algorithm on the first difference value $[I-(I_{f1}+I_{f2})]$ according to Equation (1) to obtain a first control parameter $V_{PWM1}$ of the GPA1 (or referred to as the first GPA):

$$V_{PWM1}=[I-(I_{f1}+I_{f2})]G_{pi}, \quad (1)$$

where $G_{pi}$ represents a transfer function of the PI controller 520. The transfer function $G_{pi}$ may be configured to determine a control parameter of a GPA considering a target value (e.g., the target total current value) and an output value (e.g., the total current value). In some embodiments, the transfer function $G_{pi}$ may be determined based on, for example, an integral coefficient, a proportional coefficient, and a load operably coupled to the two paralleled GPAs. An exemplary process for determining the transfer function $G_{pi}$ may be found in, for example, U.S. Ser. No. 10/863,919 B2, the content of which is incorporated herein by reference. In some embodiments, the transfer function $G_{pi}$ may be predetermined and stored in a storage device (e.g., a storage device of the controller 340, the storage device 325, or an external storage device of the MRI system 100). In some embodiments, the determined first control parameter $V_{PWM1}$ may drive a PWM generator operably coupled to the GPA1 to generate a PWM signal based on the first control parameter. The PWM signal may control an output current of the GPA1 (or referred to as the first GPA).

In some embodiments, each of the plurality of paralleled GPAs may be controlled according to the process described in operations 3001-3003. In some embodiments, the first control parameter of the first GPA (or referred to as the GPA1 in FIG. 5) may be further configured to control an output current of a second GPA of the plurality of GPAs. The second GPA may be a paralleled GPA and the first GPA may be two different parallel GPAs in a same GPA group. For example, the second GPA may be referred to as the GPA2. Since the first difference values of the plurality of paralleled GPAs are the same, and the transfer functions of the PI controller 520 and the PI controller 530 may be the same. Thus, the first control parameter of the first GPA (or referred to as the GPA1) and that of the second GPA (or referred to as the GPA2) may be the same. The determined first control parameter $V_{PWM1}$ may be used to drive a PWM generator operably coupled to the GPA2 to generate a PWM signal based on the first control parameter. The PWM signal may control an output current of the GPA2 (or referred to as the second GPA). In some embodiments, the first control parameter may be configured to control the output currents of only a portion of GPAs of the plurality of paralleled GPAs in the same GPA group. The remaining GPAs of the plurality of paralleled GPAs in the same GPA group may share the first control parameters of the portion of GPAs due to a feedforward controller in the circuit. Alternatively, the first control parameter may be configured to control each GPA of the plurality of paralleled GPAs in the same GPA group.

Figure 6:
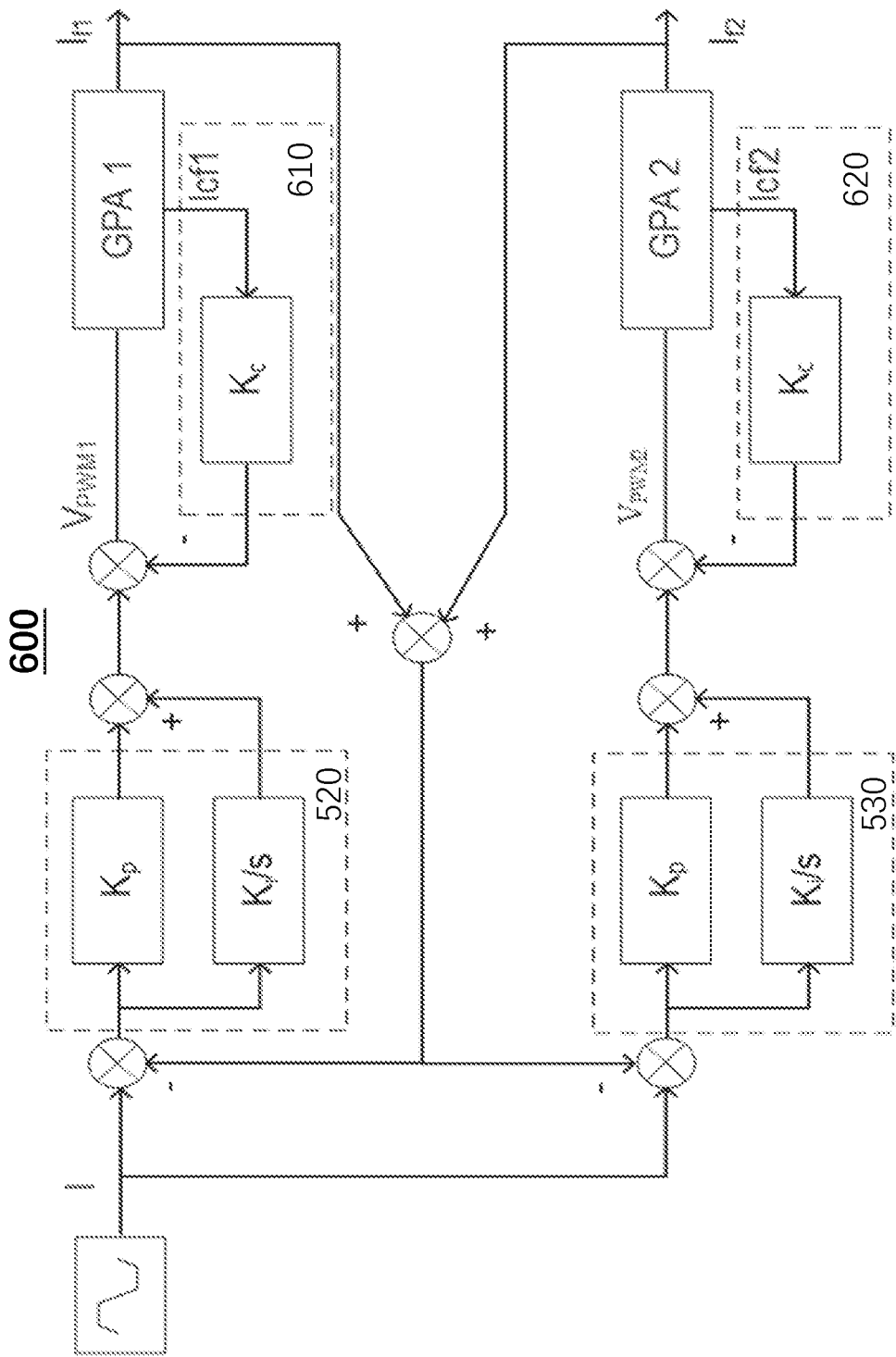
FIG. 6 is a schematic diagram illustrating an exemplary GPA control process according to some embodiments of the present disclosure.

In some embodiments, current feedback of filter capacitors of the plurality of paralleled GPAs in the circuit may also be taken into consideration to achieve a damping control. FIG. 6 is a schematic diagram illustrating an exemplary GPA control process 600 according to some embodiments of the present disclosure. As shown in FIG. 6, a filter capacitor current circuit 610 may be operably coupled to the GPA1, and a filter capacitor current circuit 620 may be operably coupled to the GPA2. Considering the filter capacitor current circuit 610, a first control parameter $V_{PWM1}$ of the GPA1 (or referred to as the first GPA) may be determined according to Equation (2):

$$V_{PWM1} = [I - (I_{f1} + I_{f2})]G_{pi} - K_c I_{cf1} + [I - (I_{f1} + I_{f2})]G_{pi} - K_c s C_{f1}(I_{f1} + I_{f2})Z_{Load},\quad (2)$$

where $I_{cf1}$ represents a current of a filter capacitor, $K_c$ represents a feedback coefficient of the filter capacitor current circuit 610, s represents a differentiator, and $Z_{Load}$ represents an impedance of a load coil. The feedback coefficient $K_c$ may represent a resistance of a virtual resistor coupled to the filter capacitor current circuit 610 in parallel. The feedback coefficient $K_c$ may be configured for damping control, and predetermined and stored in a storage device (e.g., a storage device of the controller 340, the storage device 325, or an external storage device of the MRI system 100). The feedback coefficient $K_c$ may be a numerical value.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the first control parameter may be stored in a storage device (e.g., a storage device of the controller 340, the storage device 325, or an external storage device of the MRI system 100).

Figure 7:
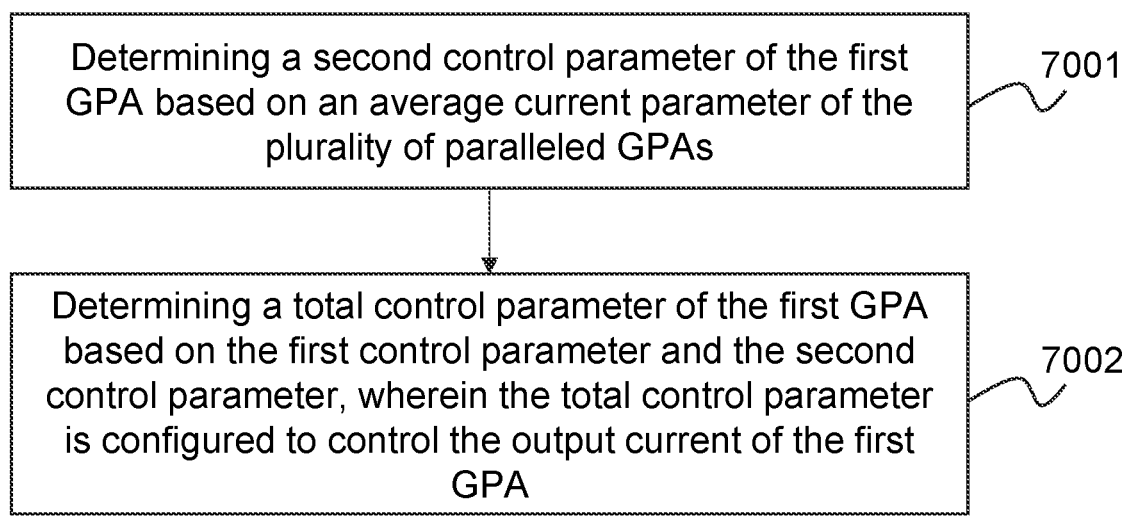
FIG. 7 is a flowchart illustrating an exemplary process for controlling a paralleled GPA according to some embodiments of the present disclosure.

FIG. 7 is a flowchart illustrating an exemplary process 700 for controlling a paralleled GPA according to some embodiments of the present disclosure. In some embodiments, the process 700 may be executed by the MRI system 100. For example, the process 700 may be implemented as a set of instructions (e.g., an application) stored in a storage device (e.g., the storage device 325). In some embodiments, the controller 340 (or the processor, the GPA controlling unit 322) may execute the set of instructions and may accordingly be directed to perform the process 700.

In 7001, the controller 340 (or the processing device 120, the processor, the GPA controlling unit 322) may determine a second control parameter of the first GPA based on an average current parameter of the plurality of paralleled GPAs.

The average current parameter of the plurality of paralleled GPAs may be an average value of the plurality of parameter values relating to current values of the plurality of paralleled GPA. For example, the average current parameter may be an average value of a plurality of output current values of the plurality of paralleled GPAs. As another example, the average current parameter may be an average value of a plurality of current errors of the plurality of GPAs. In some embodiments, the controller 340 may determine the average current parameter of the plurality of paralleled GPAs based on the total current parameter. For example, the controller 340 may determine the average current parameter by dividing the total current parameter by a count of the plurality of paralleled GPAs.

The second control parameter may be configured to use the average current parameter of the plurality of paralleled GPAs for feedback control of the first GPA. In some embodiments, the controller 340 may determine the second control parameter of the first GPA based on the average current parameter and a current parameter of the first GPA. For example, the controller 340 may obtain a first current parameter (e.g., an output current value or a current error between the output current value and a target output current value) of the first GPA from the current sensing device 330. The controller 340 may determine a second difference value based on the first current parameter and the average current parameter. For example, the second difference value may be a difference between the first current parameter of the first GPA and the average current parameter. The controller 340 may determine the second control parameter based on the second difference value using an algorithm. For example, the algorithm may include a proportional-integral (PI) algorithm, a prediction algorithm, a pole assignment algorithm, or the like, or any combination thereof.

Due to the differences among main circuits of the plurality of paralleled GPAs, circulating currents among the plurality of paralleled GPAs often exist. By controlling the plurality of paralleled GPAs using the second control parameter, the circulating current among the plurality of paralleled GPAs may be reduced or eliminated caused by the differences among main circuits of the plurality of paralleled GPAs. As shown in FIG. 4, a current sharing control of the plurality of paralleled GPAs may be achieved without using a high-inductance coupler (e.g., a current sharing reactor) of a large volume.

Figure 8:
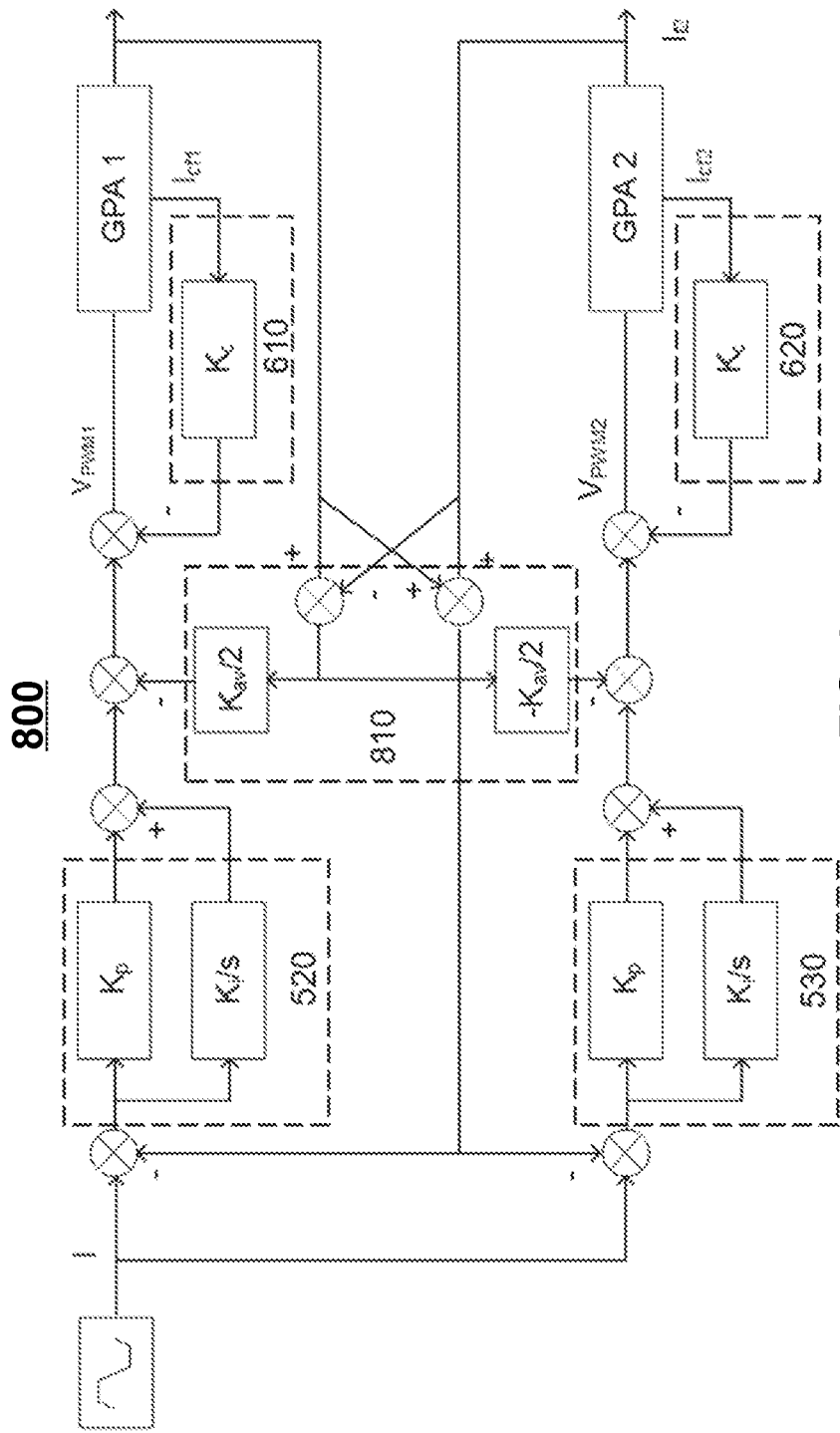
FIG. 8 is a schematic diagram illustrating an exemplary GPA control process according to some embodiments of the present disclosure.

FIG. 8 is a schematic diagram illustrating an exemplary GPA control process 800 according to some embodiments of the present disclosure. As shown in FIG. 8, an average current parameter of the two paralleled GPAs (GPA1 and GPA2) may be $(I_{f1}+I_{f2})/2$. A second difference value between the first current parameter of the first GPA and the average current parameter may be $I_{f1}-(I_{f1}+I_{f2})/2$. In some embodiments, the second control parameter may be determined according to $$K_{av}\left(I_{f1} - \frac{(I_{f1}+I_{f1})}{2}\right),$$

wherein $K_{av}$ represents a transfer function of a current sharing circuit 810. In some embodiments, the transfer function $K_{av}$ may be determined according to a same or similar process to that of the transfer function $G_{pi}$. In some embodiments, the transfer function $K_{av}$ may be empirically determined based on prior data or experience and stored in a storage device (e.g., a storage device of the controller 340, the storage device 325, or an external storage device of the MRI system 100).

In 7002, the controller 340 (or the processing device 120, the processor, the GPA controlling unit 322) may determine a total control parameter of the first GPA based on the first control parameter (determined according to the process 300 as shown in FIG. 3 and the description thereof) and the second control parameter.

The total control parameter may be configured to use both the total current parameter and the average current parameter of the plurality of paralleled GPAs for feedback control of the first GPA. In some embodiments, the second control parameter relating to the average current parameter of the plurality of paralleled GPAs may negatively compensate the first control parameter relating to the total current parameter of the plurality of paralleled GPAs. As used herein, "negatively compensate the first control parameter" refers that if the first current parameter of the first GPA is greater than a first threshold, the second control parameter may be a negative value to reduce the total control parameter, thereby reducing the first current parameter of the first GPA. If the first current parameter of the first GPA is smaller than a second threshold, the second control parameter may be a positive value to increase the total control parameter, thereby increasing the first current parameter of the first GPA. The first threshold may be greater than or equal to the second threshold. For example, the total control parameter may be determined according to Equation (3):

$$V_{PWM1} = [I - (I_{f1} + I_{f2})]G_{pi} - K_{av}\left(I_{f1} - \frac{(I_{f1} + I_{f1})}{2}\right) \quad (3)$$

where $[I-(I_{f1}+I_{f2})]G_{pi}$ represents the first control parameter, and $$K_{av}\left(I_{f1} - \frac{(I_{f1} + I_{f1})}{2}\right)$$

represents the second control parameter.

Referring back to FIG. 8, the current feedback of the filter capacitors of the plurality of paralleled GPAs in the circuit may also be taken into consideration to achieve a damping control. The total control parameter $V_{PWM1}$ of the GPA1 (or referred to as the first GPA) may be determined according to Equation (4):

$$V_{PWM1} = [I - (I_{f1} + I_{f2})]G_{pi} - K_c I_{cf1} - \quad (4)$$
$$K_{av}\left(I_{f1} - \frac{(I_{f1} + I_{f1})}{2}\right) = [I - (I_{f1} + I_{f2})]G_{pi} -$$
$$K_c s C_{f1}(I_{f1} + I_{f2})Z_{Load} - K_{av}\frac{(I_{f1} - I_{f2})}{2},$$

where $I_{cf1}$ represents a current of a filter capacitor, $K_c$ represents a feedback coefficient of the filter capacitor current circuit 610, s represents a differentiator, $Z_{Load}$ represents an impedance of a load coil (e.g., a gradient coil 410), $[I-(I_{f1}+I_{f2})]G_{pi}$ represents the first control parameter, and $$K_{av}\left(I_{f1} - \frac{(I_{f1} + I_{f1})}{2}\right)$$

represents the second control parameter. The feedback coefficient $K_c$ may be configured for damping control, and predetermined and stored in a storage device (e.g., a storage device of the controller 340, the storage device 325, or an external storage device of the MRI system 100).

In some embodiments, each GPA of the plurality of paralleled GPAs may be controlled according to the process 700. For example, as shown in FIG. 8, the PI controller 520, the filter capacitor current circuit 610, and the current sharing circuit 810 may be used to determine the total control parameter of the GPA 1 for controlling an output current value of the GPA1. A PI controller 530, the filter capacitor current circuit 620, and the current sharing circuit 810 may be used to determine the total control parameter of the GPA 2 for controlling an output current value of the GPA2.

In some circumstances (e.g., a bandwidth of a circulating current in the circuit being below a predetermined bandwidth, e.g., 10 kHz), as shown in FIG. 4, no coupler is needed to control the outputs of the plurality of paralleled GPAs. In some other circumstances (e.g., a bandwidth of the circulating current in the circuit exceeding the predetermined bandwidth, e.g., 10 kHz), a low-inductance coupler (e.g., a magnetic core) of a small volume may be used together with a current-sharing circuit considering the total control parameter to control currents of the plurality of paralleled GPAs as exemplified in FIG. 9.

Figure 9:
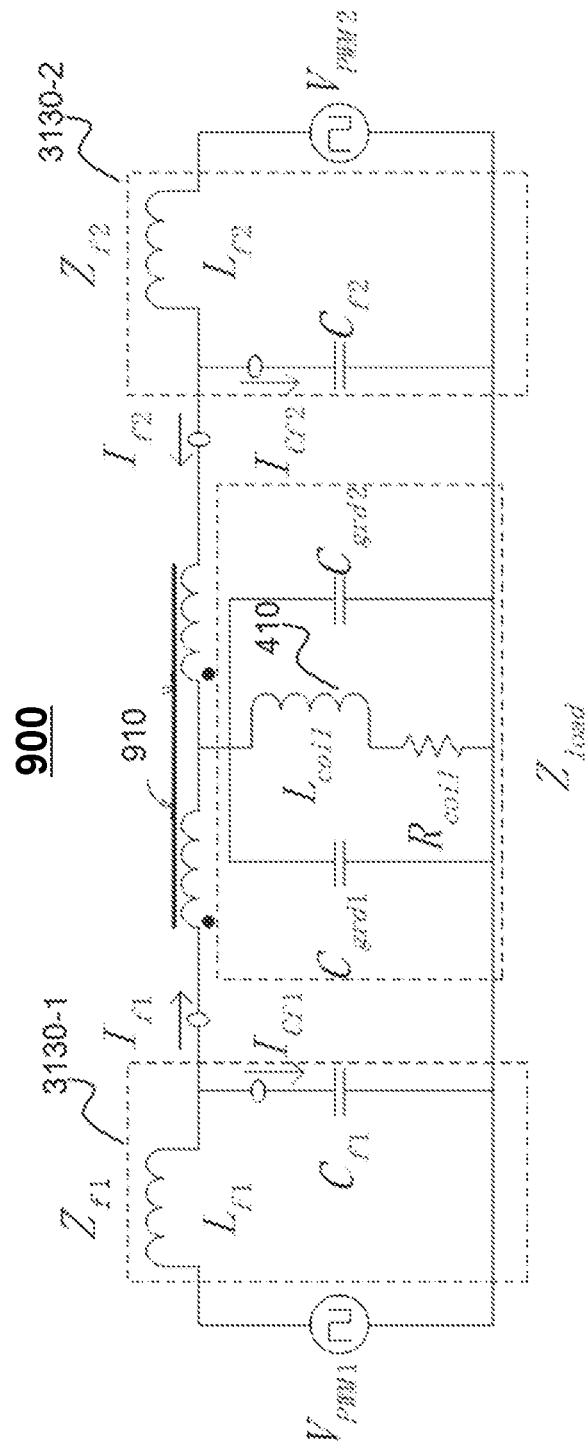
FIG. 9 is a schematic diagram illustrating an exemplary circuit according to some embodiments of the present disclosure.

FIG. 9 is a schematic diagram illustrating an exemplary circuit 900 according to some embodiments of the present disclosure. As shown in FIG. 9, a GPA 3130-1 and a GPA 3130-2 operate in-phase into a common gradient coil 410 to form two paralleled GPAs 3130. $L_{f1}$ represents an inductance of an output filter of the GPA 3130-1, $L_{f2}$ represents an inductance of an output filter of the GPA 3130-2, $C_{f1}$ represents a capacitance of the output filter of the GPA 3130-1, $C_{f2}$ represents a capacitance of the output filter of the GPA 3130-2, $L_{coil}$ represents an equivalent inductance of the gradient coil 410, $R_{coil}$ represents an equivalent resistance of the gradient coil 410, $C_{grd1}$ and $C_{grd1}$ represent capacitances of filters of the gradient coil 410, $V_{PWM1}$ represents an output voltage of the GPA 3130-1, and $V_{PWM2}$ represents an output voltage of the GPA 3130-2. An output current parameter (an output current value) of the GPA 3130-1 may be $I_{f1}$, and an output parameter (an output current value) of the GPA 3130-2 may be $I_{f2}$. The total current parameter of the two paralleled GPAs 3130 may be $I_{f1}+I_{f2}$.

A low-inductance coupler 910 of a small volume, instead of a high-inductance coupler of a large volume, is operably coupled to the gradient coil 410 for isolating the two paralleled GPAs such that the circulating current between the two paralleled GPAs 3130 may be reduced. The coupler 910 may be configured for current sharing control of the plurality of paralleled GPAs 3130. An inductance of the coupler 910 may be less than a predetermined value, for example, 100 pH. An exemplary low-inductance coupler may include a current sharing reactor, a transformer, a magnetic core, or the like, or any combination thereof. Using the low-inductance coupler (or even without using any coupler) may reduce the volume of the MRI system and the hardware cost of the MRI system. It should be noted that FIGS. 4 and 9 are for illustration purposes only and not intended to be limiting. Other circuits or processes may also be used to improve the stability of the gradient field. For example, additionally or alternatively, the plurality of paralleled GPAs may be controlled using an interleaving parallel technology to reduce ripples of output currents of the plurality of paralleled GPAs and reduce electromagnetic interference.

In some embodiments, the first control parameter or the total control parameter of the first GPA may be transmitted to a PWM generator that is operably coupled to the first GPA, and the PWM generator may generate a PWM signal for controlling an output current of the first GPA. In some embodiments, an evaluation parameter for evaluating a current sharing control performance of the control process of the present disclosure may be determined. The evaluation parameter may include an open-loop transfer function, a closed-loop transfer function, a circulating current transfer function, or the like, or any combination thereof of the circuit. In some embodiments, the evaluation parameter may be determined using a Bode plot. The Bode plot may be a graph representing a frequency response of a system. The Bode plot may include a Bode magnitude plot representing a magnitude of the frequency response and a Bode phase plot representing a phase shift. According to the Bode plot, current sharing control performance, such as a gain corresponding to a frequency, a phase margin, a magnitude margin, etc., may be determined.

For example, combining FIGS. 4 and 5, an output current parameter $I_{f1}$ of GPA1 may be determined according to Equation (5):

$$I_{f1} = \frac{V_{PWM1} - (I_{f1} + I_{f2})Z_{Load}}{sL_{f1}} - sC_{f1}[(I_{f1} + I_{f2})Z_{Load}], \quad (5)$$

where $V_{PWM1}$ represents a voltage of a first PWM generator PWM1 (or referred to as the first control parameter), $Z_{Load}$ represents an impedance of a load coil (e.g., a gradient coil 410), $I_{f2}$ represents an output current parameter of the GPA2, s represents a differentiator, and $C_{f1}$ represents a capacitance of the GPA1.

Equations (6) and (7) may be determined according to Equation (5):

$$I_{f1}sL_{f1} = [I - (I_{f1} + I_{f2})]G_{pi} - (I_{f1} + I_{f2})Z_{Load} - s^2L_{f1}C_{f1}(I_{f1} + I_{f2})Z_{Load}, \quad (6)$$

$$I_{f2}sL_{f2} = [I - (I_{f1} + I_{f2})]G_{pi} - (I_{f1} + I_{f2})Z_{Load} - s^2L_{f2}C_{f2}(I_{f1} + I_{f2})Z_{Load}, \quad (7)$$

where I represents a target current parameter, $G_{pi}$ represents a transfer function of a PI controller (the PI controller 520 or the PI controller 530), $L_{f1}$ represents an inductance of an output filter of the GPA1, $L_{f2}$ represents an inductance of an output filter of the GPA2, and $C_{f2}$ represents a capacitance of the output filter of the GPA2.

In some embodiments, if a difference between the filter parameters (e.g., inductances of the output filters) of the two paralleled GPAs are neglected, Equation (8) may be determined by adding Equations (6) and (7)

$$(I_{f1} + I_{f2})[sL_f + 2G_{pi} + 2(1 + L_fC_fs^2)Z_{Load}] = 2IG_{pi}, \quad (8)$$

where $L_{f1}$ may be equal to $L_{f2}$, thereby both being represented by $L_f$, and $C_{f1}$ may be equal to $C_{f2}$, thereby both being represented by $C_f$.

A closed-loop transfer function $$\frac{I_{f1} + I_{f2}}{I}$$

may De determined according to Equation (9):

$$\frac{I_{f1} + I_{f2}}{I} = \frac{G_{pi}}{0.5sL_f + G_{pi} + (1 + L_fC_fs^2)Z_{Load}}. \quad (9)$$

An open-loop transfer function of $$\frac{I_{f1} + I_{f2}}{I_{err}}$$

may be determined according to Equation (10):

$$\frac{I_{f1} + I_{f2}}{I_{err}} = \frac{G_{pi}}{0.5sL_f + (1 + L_fC_fs^2)Z_{Load}}, \quad (10)$$

where $I_{err}$ represents a total current error relating to $(I_{f1} + I_{f2})$.

A current transfer function of the GPA 1 or the GPA 2 may be determined according to Equation (11):

$$\frac{I_{f1}}{I} = \frac{I_{f2}}{I} = \frac{0.5G_{pi}}{0.5sL_f + G_{pi} + (1 + L_fC_fs^2)Z_{Load}}. \quad (11)$$

In some embodiments, if the difference between the filter parameters (e.g., inductances of the output filters) of the two paralleled GPAs is taken into consideration, $L_{f1} = L_f + \Delta L_f$, $L_{f2} = L_f - \Delta L_f$. In such cases, Equation (6) may be transformed into Equation (12):

$$I_{f1}s(L_f + \Delta L_f) = [I - (I_{f1} + I_{f2})]G_{pi} - (I_{f1} + I_{f2})Z_{Load} - s^2(L_f + \Delta L_f)C_f(I_{f1} + I_{f2})Z_{Load}, \quad (12)$$

and Equation (7) may be transformed into Equation (13):

$$I_{f2}s(L_f + \Delta L_f) = [I - (I_{f1} + I_{f2})]G_{pi} - (I_{f1} + I_{f2})Z_{Load} - s^2(L_f + \Delta L_f)C_f(I_{f1} + I_{f2})Z_{Load}, \quad (13)$$

where $\Delta L_f$ represents an inductance difference between the output filters of the GPA1 and the GPA2.

Equation (14) may be determined by subtracting Equation (13) from Equation (12):

$$(I_{f1} + I_{f2})L_fs + \Delta L_f(I_{f1} + I_{f2})s = -2s^2\Delta L_fC_f(I_{f1} + I_{f2})Z_{Load}. \quad (14)$$

A circulating current transfer function $$\frac{I_{f1} - I_{f2}}{I_{f1} + I_{f2}}$$

of the two paralleled GPAs may be determined according to Equation (15):

$$\frac{I_{f1} - I_{f2}}{I_{f1} + I_{f2}} = -\frac{\Delta L_f}{L_f}(2C_fZ_{Load}s + 1). \quad (15)$$

In some embodiments, if the current feedback of the filter capacitors in the circuit is taken into consideration, referring back to FIGS. 4 and 6, $I_{f1}$ may be determined according to Equation (16):

$$I_{f1} = \frac{V_{PWM1} - (I_{f1} + I_{f2})Z_{Load}}{sL_{f1}} - sC_{f1}[(I_{f1} + I_{f2})Z_{Load}], \quad (16)$$

Equation (16) may be transformed into Equation (17):

$$I_{f1}sL_{f1} = [I - (I_{f1} + I_{f2})]G_{pi} - K_csC_{f1}(I_{f1} + I_{f2})Z_{Load} - (I_{f1} + I_{f2})Z_{Load} - s^2L_{f1}C_{f1}(I_{f1} + I_{f2})Z_{Load}, \quad (17)$$

$I_{f2}$ may be determined according to Equation (16) by replacing $V_{PWM1}$ with $V_{PWM2}$, replacing $L_{f1}$ with $L_{f2}$, and replacing $C_{f1}$ with $C_{f2}$, thereby providing Equation (18):

$$I_{f2}sL_{f2} = [I - (I_{f1} + I_{f2})]G_{pi} - K_csC_{f2}(I_{f1} + I_{f2})Z_{Load} - (I_{f1} + I_{f2})Z_{Load} - s^2L_{f2}C_{f2}(I_{f1} + I_{f2})Z_{Load}. \quad (18)$$

In some embodiments, if a difference between the filter parameters (e.g., inductances of the output filters) of the two paralleled GPAs is neglected, Equation (19) may be generated by adding Equations (17) and (18):

$$(I_{f1}+I_{f2})[sL_f+2G_{pi}+2(1+K_cC_fs+L_fC_fs^2)Z_{Load}]=2IG_{pi}. \quad (19)$$

A closed-loop transfer function $$\frac{I_{f1}+I_{f2}}{I}$$

may be determined according to Equation (20):

$$\frac{I_{f1}+I_{f2}}{I}=\frac{G_{pi}}{0.5sL_f+G_{pi}+(1+K_cC_fs+L_fC_fs^2)Z_{Load}}. \quad (20)$$

An open-loop transfer function of $$\frac{I_{f1}+I_{f2}}{I_{err}}$$

may be determined according to Equation (21):

$$\frac{I_{f1}+I_{f2}}{I_{err}}=\frac{G_{pi}}{0.5sL_f+(1+K_cC_fs+L_fC_fs^2)Z_{Load}}. \quad (21)$$

A current transfer function of the GPA 1 or the GPA 2 may be determined according to Equation (22):

$$\frac{I_{f1}}{I}=\frac{I_{f2}}{I}=\frac{0.5G_{pi}}{0.5sL_f+G_{pi}+(1+K_cC_fs+L_fC_fs^2)Z_{Load}}. \quad (22)$$

In some embodiments, if the difference between the filter parameters (e.g., inductances of the output filters) of the two paralleled GPAs is taken into consideration, $L_{f1}=L_f+\Delta L_f$, $L_{f2}=L_f-\Delta L_f$. In such cases, Equation (17) may be transformed into Equation (23):

$$I_{f1}s(L_f+\Delta L_f)=[I-(I_{f1}+I_{f2})]G_{pi}-K_csC_f(I_{f1}+I_{f2})Z_{Load}-(I_{f1}+I_{f2})Z_{Load}-s^2(L_f+\Delta L_f)C_f(I_{f1}+I_{f2})Z_{Load}, \quad (23)$$

and Equation (18) may be transformed into Equation (24):

$$I_{f2}s(L_f+\Delta L_f)=[I-(I_{f1}+I_{f2})]G_{pi}-K_csC_f(I_{f1}+I_{f2})Z_{Load}-(I_{f1}+I_{f2})Z_{Load}-s^2(L_f+\Delta L_f)C_f(I_{f1}+I_{f2})Z_{Load}. \quad (24)$$

Equation (25) may be determined by subtracting Equation (24) from Equation (23):

$$(I_{f1}-I_{f2})L_fs+\Delta L_f(I_{f1}+I_{f2})s=-2s^2\Delta L_fC_f(I_{f1}+I_{f2})Z_{Load}. \quad (25)$$

A circulating current transfer function $$\frac{I_{f1}-I_{f2}}{I_{f1}+I_{f2}}$$

of the two paralleled GPAs may be determined according to Equation (26):

$$\frac{I_{f1}-I_{f2}}{I_{f1}+I_{f2}}=-\frac{\Delta L_f}{L_f}(2C_fZ_{Load}s+1). \quad (26)$$

Similarly, combining FIGS. 4 and 8, a circulating current transfer function $$\frac{I_{f1}-I_{f2}}{I_{f1}+I_{f2}}$$

of the two paralleled GPAs may be determined according to Equation (27):

$$\frac{I_{f1}-I_{f2}}{I_{f1}+I_{f2}}=-\frac{\Delta L_fs}{L_fs+0.5k_{av}}(2C_fZ_{Load}s+1). \quad (27)$$

According to Equation (27), the second control parameter associated with a feedback control using the average current parameter of the plurality of paralleled GPAs may provide the effect of introducing a virtual impedance. It should be noted that the above functions are only for illustration purposes and not intended to be limiting. Other evaluation parameters may also be used to evaluate the current sharing control performance of the control process of the present disclosure. In some embodiments, one or more equations used herein may be replaced or modified.

Figure 10:
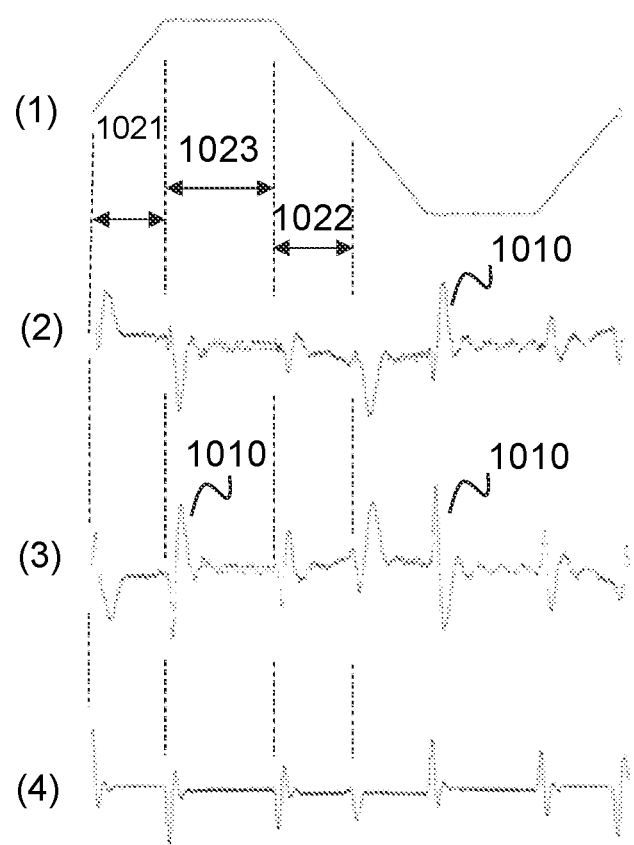
FIG. 10 illustrates exemplary waveforms depicting current parameters of two paralleled GPAs controlled according to some embodiments of the present disclosure.

FIG. 10 illustrates exemplary waveforms depicting current parameters of two paralleled GPAs controlled according to some embodiments of the present disclosure. As shown in FIG. 10, (1) illustrates a waveform of output currents of one of the two paralleled GPAs; (2) illustrates a waveform of current errors of a first GPA of the two paralleled GPAs; (3) illustrates a waveform of current errors of a second GPA of the two paralleled GPAs; and (4) illustrates a waveform of errors of total output currents of the two paralleled GPAs. As shown in FIG. 10, glitches 1010 in the waveforms (2) and (3) indicate that circulating currents between the two paralleled GPAs exist. However, the waveform (4) is relatively smooth in each period (e.g., a period 1021, a period 1022, a period 1023) and has a rapid convergence, thereby achieving a steady and current sharing control. The period 1021 may refer to a duration that a gradient signal takes to reach the peak from zero. The period 1022 may refer to a duration that the gradient signal takes to reach zero from the peak. The period 1022 may refer to a duration that the gradient signal takes to maintain the peak.

During generating an MRI image, uniform differences between total output current and target current parameters of every period are important for the quality of the MRI image. The better the uniformity, the clearer the MRI image may be. By controlling the two paralleled GPAs controlled according to exemplary process described in the present disclosure, the waveform (4) illustrating a relatively smooth waveform in each period may result in a relative clear MRI image.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±1%, ±5%, ±10%, or ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A gradient power amplifier (GPA) system, comprises:
a plurality of paralleled GPAs; and
at least one controller operably coupled to the plurality of paralleled GPAs, the at least one controller being configured to perform operations including:
obtaining a total current parameter of the plurality of paralleled GPAs;
determining, based on the total current parameter and a target current parameter, a first difference value; and
determining, based on the first difference value, a first control parameter of a first GPA of the plurality of paralleled GPAs, wherein the first control parameter is configured to control an output current of the first GPA, wherein the obtaining the total current parameter of the plurality of paralleled GPAs includes:
determining a sum of a plurality of output current parameters of the plurality of paralleled GPAs as the total current parameter, wherein each of the plurality output current parameters corresponds to a GPA of the plurality of paralleled GPAs.

2. The GPA system of claim 1, wherein the first control parameter of the first GPA is determined based on the first difference value using at least one of: a proportional-integral (PI) algorithm, a prediction algorithm, or a pole assignment algorithm.

3. The GPA system of claim 1, wherein the first control parameter is further configured to control an output current of a second GPA of the plurality of GPAs.

4. The GPA system of claim 1, wherein the at least one controller is further configured to perform the operations including:
determining a second control parameter of the first GPA based on an average current parameter of the plurality of paralleled GPAs; and
determining a total control parameter of the first GPA based on the first control parameter and the second control parameter, wherein the total control parameter is configured to control the output current of the first GPA.

5. The GPA system of claim 4, wherein the determining the second control parameter of the first GPA includes:
determining, based on the total current parameter, the average current parameter of the plurality of paralleled GPAs;
obtaining a first current parameter of the first GPA;
determining, based on the first current parameter and the average current parameter, a second difference value; and
determining, based on the second difference value, the second control parameter.

6. The GPA system of claim 1, further comprising a coupler configured for current sharing control of the plurality of paralleled GPAs.

7. The GPA system of claim 6, wherein the coupler includes at least one of a current sharing reactor, a transformer, or a magnetic core.

8. The GPA system of claim 1, wherein the obtaining the total current parameter of the plurality of GPAs includes:
obtaining an output current parameter of a circuit of the plurality of GPAs as the total current parameter.

9. The GPA system of claim 1, wherein the total current parameter is a total output current value of the plurality of GPAs or a total current error of the plurality of GPAs, wherein the total current error is a difference between the total output current value and the target current parameter.

10. The GPA system of claim 1, further comprising at least one current sensing device for obtaining the total current parameter of the plurality of paralleled GPAs or an output current parameter of each of the plurality of paralleled GPAs.

11. A method for controlling a gradient power amplifier (GPA) system including a plurality of paralleled GPAs and at least one controller operably coupled to the plurality of paralleled GPAs, comprises:
obtaining a total current parameter of the plurality of paralleled GPAs;
determining, based on the total current parameter and a target current parameter, a first difference value; and
determining, based on the first difference value, a first control parameter of a first GPA of the plurality of paralleled GPAs, wherein the first control parameter is configured to control an output current of the first GPA, wherein the obtaining the total current parameter of the plurality of paralleled GPAs includes:
determining a sum of a plurality of output current parameters of the plurality of paralleled GPAs as the total current parameter, wherein each of the plurality output current parameters corresponds to a GPA of the plurality of paralleled GPAs.

12. The method of claim 11, wherein the first control parameter of the first GPA is determined based on the first difference value using at least one of: a proportional-integral (PI) algorithm, a prediction algorithm, or a pole assignment algorithm.

13. The method of claim 11, wherein the first control parameter is further configured to control an output current of a second GPA of the plurality of GPAs.

14. The method of claim 11, further comprising:
determining a second control parameter of the first GPA based on an average current parameter of the plurality of paralleled GPAs; and
determining a total control parameter of the first GPA based on the first control parameter and the second control parameter, wherein the total control parameter is configured to control the output current of the first GPA.

15. The method of claim 14, wherein the determining a second control parameter of the first GPA comprises:
determining, based on the total current parameter, the average current parameter of the plurality of paralleled GPAs;
obtaining a first current parameter of the first GPA;
determining, based on the first current parameter and the average current parameter, a second difference value; and
determining, based on the second difference value, the second control parameter.

16. The method of claim 11, wherein the GPA system further includes a coupler configured for current sharing control of the plurality of paralleled GPAs.

17. The method of claim 16, wherein the coupler includes at least one of a current sharing reactor, a transformer, or a magnetic core.

18. The method of claim 11, wherein the obtaining a total current parameter of the plurality of GPAs comprises:
obtaining an output current parameter of a circuit of the plurality of GPAs as the total current parameter.

19. A non-transitory readable medium, comprising at least one set of instructions for controlling a gradient power amplifier (GPA) system including a plurality of paralleled GPAs, wherein when executed by at least one processor, the at least one set of instructions directs the at least one processor to perform a method, the method comprising:
- obtaining a total current parameter of the plurality of paralleled GPAs;
- determining, based on the total current parameter and a target current parameter, a first difference value; and
- determining, based on the first difference value, a first control parameter of a first GPA of the plurality of paralleled GPAs, wherein the first control parameter is configured to control an output current of the first GPA, wherein the obtaining the total current parameter of the plurality of paralleled GPAs includes:
  - determining a sum of a plurality of output current parameters of the plurality of paralleled GPAs as the total current parameter, wherein each of the plurality output current parameters corresponds to a GPA of the plurality of paralleled GPAs.

* * * * *